United States Patent
Kim et al.

(10) Patent No.: US 11,661,530 B2
(45) Date of Patent: May 30, 2023

(54) PREPARING METHOD OF POLISHING COMPOSITION

(71) Applicant: Research & Business Foundation Sungkyunkwan University, Suwon-si (KR)

(72) Inventors: Taesung Kim, Seoul (KR); Eungchul Kim, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 17/330,494

(22) Filed: May 26, 2021

(65) Prior Publication Data

US 2021/0388233 A1 Dec. 16, 2021

(30) Foreign Application Priority Data

Jun. 12, 2020 (KR) .................. 10-2020-0071690

(51) Int. Cl.
*C09G 1/02* (2006.01)
*H01L 21/306* (2006.01)

(52) U.S. Cl.
CPC .......... *C09G 1/02* (2013.01); *H01L 21/30625* (2013.01)

(58) Field of Classification Search
None
See application file for complete search history.

(56) References Cited

U.S. PATENT DOCUMENTS

| | | | | |
|---|---|---|---|---|
| 5,174,877 A | * | 12/1992 | Cooper | C02F 1/725 |
| | | | | 204/157.4 |
| 2006/0234509 A1 | * | 10/2006 | Small | C09G 1/02 |
| | | | | 438/692 |
| 2020/0032104 A1 | * | 1/2020 | Nakagawa | B24B 37/044 |

FOREIGN PATENT DOCUMENTS

| | | |
|---|---|---|
| JP | 2002-517836 A | 6/2002 |
| KR | 10-2010-0042022 A | 4/2010 |
| KR | 10-2017-0003147 A | 1/2017 |
| KR | 10-2017-0004462 A | 1/2017 |
| KR | 10-1927481 B1 | 12/2018 |
| KR | 10-2020-0018338 A | 2/2020 |

OTHER PUBLICATIONS

Korean Office Action dated Jan. 21, 2022 in corresponding Korean Application No. 10-2020-0071690 (4 pages in Korean language).
Korean Office Action dated Jan. 25, 2022 in counterpart Korean Patent Application No. 10-2020-0110864 (5 pages in Korean).

\* cited by examiner

*Primary Examiner* — Stephanie P Duclair
(74) *Attorney, Agent, or Firm* — NSIP Law

(57) ABSTRACT

A method of preparing a polishing composition includes forming a dispersion solution containing ceria particles, and irradiating ultraviolet (UV) light onto the dispersion solution.

11 Claims, 15 Drawing Sheets

FIG. 9
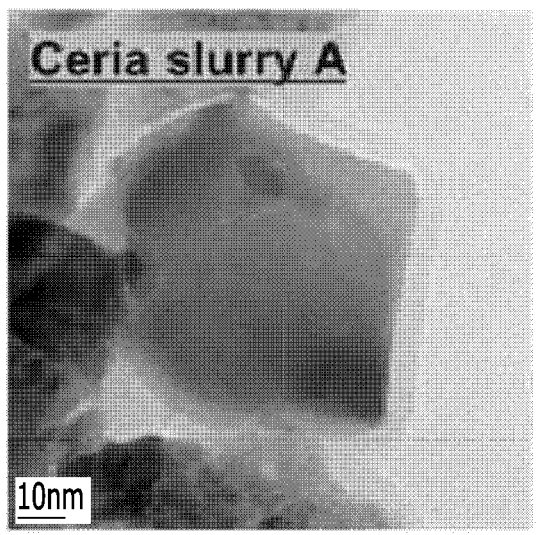
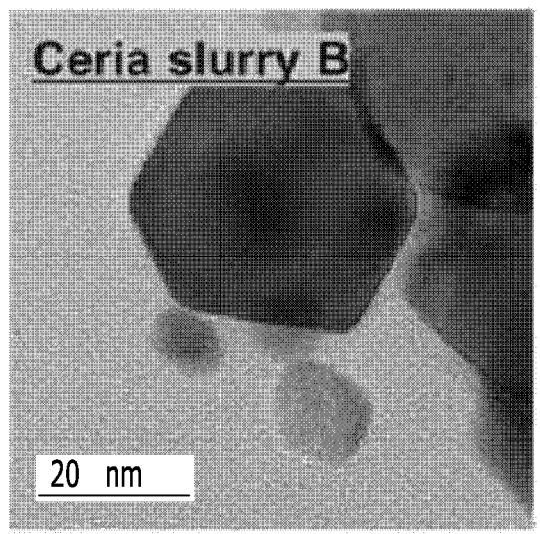

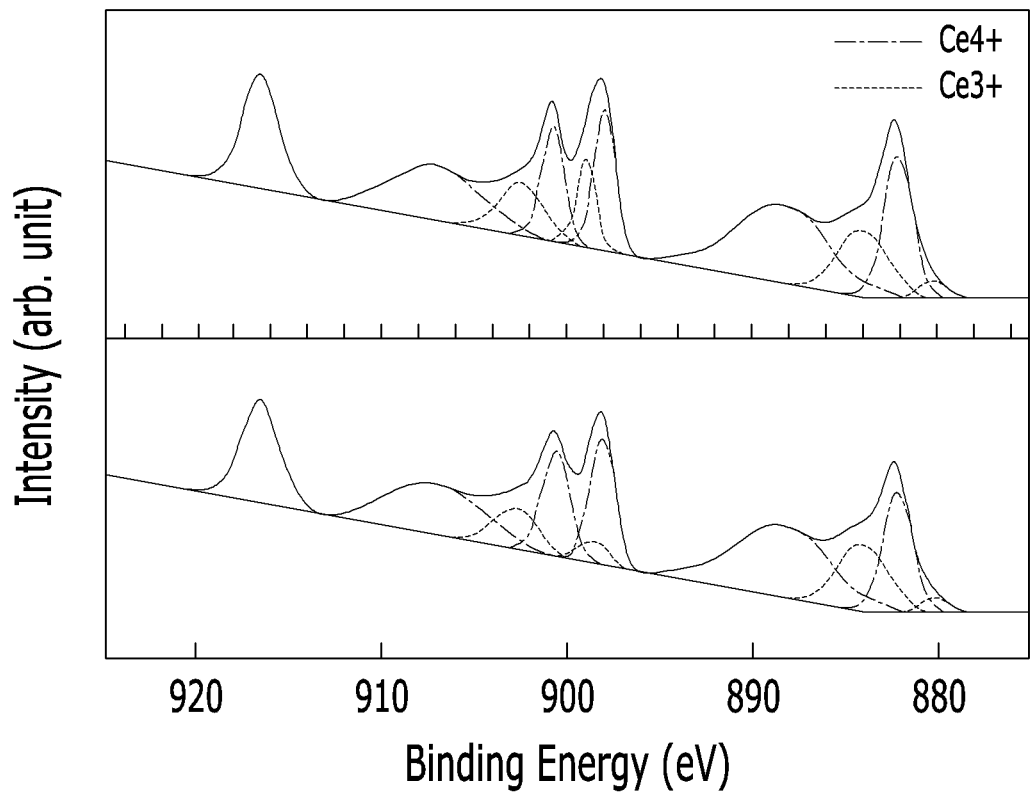
FIG. 10A
Ceria slurry A
$[Ce^{3+}]=14.40\%$
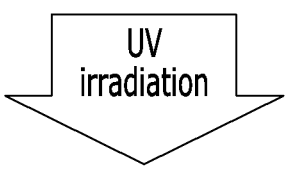
UV irradiation
$[Ce^{3+}]=21.85\%$

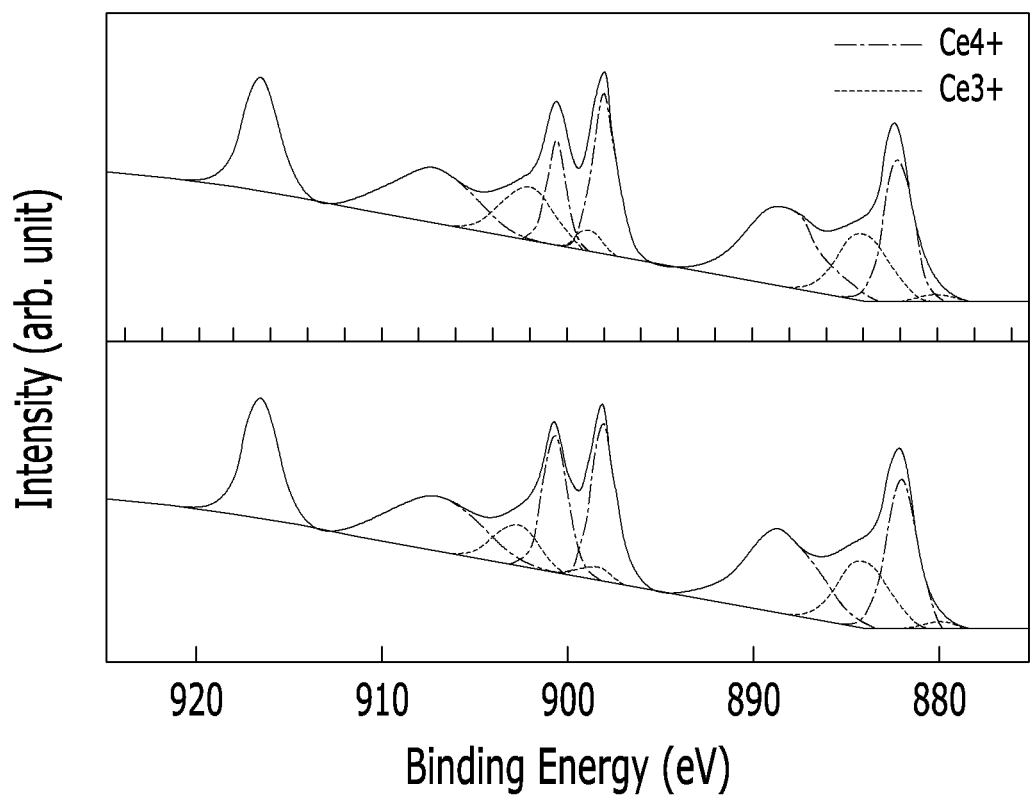
FIG. 10B
Ceria slurry B
$[Ce^{3+}] = 13.24\%$
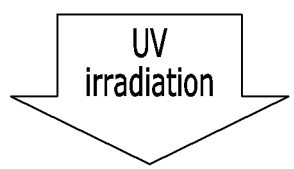
UV irradiation
$[Ce^{3+}] = 20.70\%$

PREPARING METHOD OF POLISHING COMPOSITION

CROSS-REFERENCE TO RELATED APPLICATION

This application claims the benefit under 35 USC 119(a) of Korean Patent Application No. 10-2020-0071690 filed on Jun. 12, 2020 in the Korean Intellectual Property Office, the entire disclosure of which is incorporated herein by reference for all purposes.

BACKGROUND

1. Field

The present disclosure relates to a method of preparing a polishing composition.

2. Description of Related Art

Chemical mechanical polishing (CMP) is a polishing process in which mechanical or chemical actions are combined into a single processing method. It is widely used for the manufacturing of wafers and the forming of devices and wirings. A semiconductor process employing planarization through CMP achieves an increase in the device density within a chip and a further decrease in critical dimension. CMP is classified into oxide CMP for forming an interlayer dielectric (ILD) layer, a metal CMP for forming a metal wiring such as aluminum (Al), tungsten (W), copper (Cu), or the like, and shallow trench isolation (STI) CMP for increasing electrical isolation between devices and thus improving their operational characteristics and integration density depending on the processing target and purpose. Particularly, polishing materials contained in a slurry mainly used in oxide CMP may include silica $SiO_2$ and ceria ($CeO_2$).

Silicon oxide (silica) is a widely used material as a dielectric material in the semiconductor industry, and particularly, ceria has excellent polishing efficiency with respect to silica. Recently, a polishing technique capable of improving a removal rate by increasing the percentage of trivalent cerium ions ($Ce^{3+}$) on a ceria polishing material has attracted a lot of attention. However, in a conventional technique, using the same needs to use a chemical additive in order to increase the percentage of $Ce^{3+}$.

Korean Patent Laid-open Publication No. 10-2020-0018338, which is the background technology of the present disclosure, relates to a polishing composition including ceria coated silica particles and organic acids having one selected from the group consisting of sulfonic acid group, phosphonic acid group, pyridine compound, and combinations thereof, with pH between 5 and 10 and electrical conductivity between 0.2 mS and 10 mS per centimeter, and discloses that sulfonic acid (or phosphonic acid phosphinic acid) reduces oxides in ceria to make more $Ce^{3+}$ available to increase the polishing rate. However, a technique of increasing $Ce^{3+}$ by reducing ceria with ultraviolet light without using a chemical additive is not described.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of preparing a polishing composition includes forming a dispersion solution containing ceria particles, and irradiating ultraviolet (UV) light onto the dispersion solution.

An oxygen vacancy may be formed on the ceria particles through the irradiating the UV light.

Additional trivalent cerium cations ($Ce^{3+}$) may be formed on the ceria particles through the irradiating of the UV light.

A removal rate of the polishing composition may be regulated by regulating an irradiation time of the UV light.

The dispersion solution may further contain a polymer.

The polymer may include a member selected from the group consisting of polymethacrylate, ammonium polymethacrylate, polycarboxylic acid, carboxyl acrylic polymer, and combinations thereof.

In the polishing composition, an amount of the polymer may be from 0.05 parts by weight to 0.2 parts by weight based on 100 parts by weight of the polishing composition.

The dispersion solution may further contain amino acid.

The amino acid may include a member selected from the group consisting of tryptophan, tyrosine, cysteine, proline, alanine, isoleucine, glycine, valine, phenylalanine, leucine, methionine, asparagine, threonine, glutamine, serine, histidine, arginine, lysine, glutamic acid, aspartic acid, and combinations thereof.

In the polishing composition, an amount of the amino acid may be from 0.05 parts by weight to 0.2 parts by weight based on 100 parts by weight of the polishing composition.

A polishing composition may be prepared by the method of claim 1.

A chemical mechanical polishing method, includes coating the polishing composition on a polishing target object, and applying a mechanical force onto the polishing target object coated with the polishing composition.

The polishing target object may include a material selected from the group consisting of a substrate on which an insulating film is formed, a semiconductor substrate, a metal film, and combinations thereof.

Other features and aspects will be apparent from the following detailed description, the drawings, and the claims.

BRIEF DESCRIPTION OF DRAWINGS

FIG. 9 provides transmission electron microscope (TEM) images of ceria slurries used for preparing a polishing composition according to an example of the present disclosure.

FIG. 10A is the result of X-ray photoelectron spectroscopy (XPS) showing changes in the concentration of trivalent cerium ions caused by irradiation of UV light in a method of preparing a polishing composition according to an example of the present disclosure.

FIG. 10B is the result of X-ray photoelectron spectroscopy (XPS) showing changes in the concentration of trivalent cerium ions caused by irradiation of UV light in a method of preparing a polishing composition according to an example of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
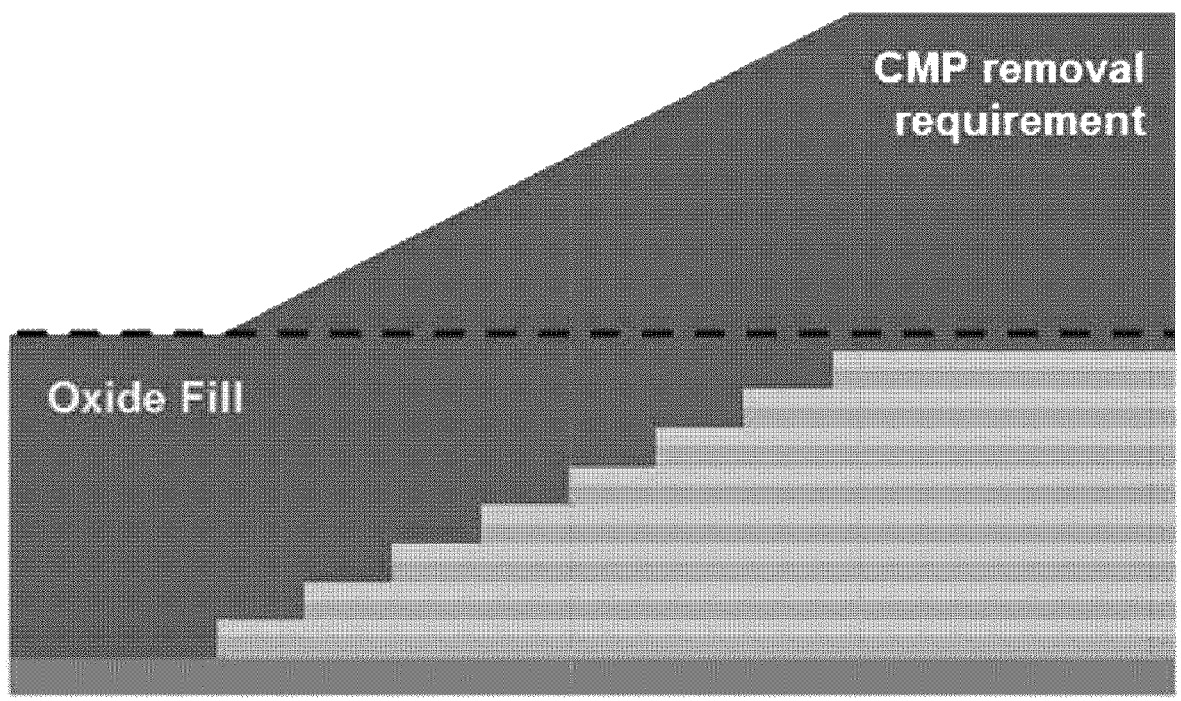
FIG. 1 is a conceptual diagram showing a problem caused by high integration of a semiconductor.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

According to a first aspect of the present disclosure, there is provided a method of preparing a polishing composition, including a process of forming a dispersion solution containing ceria particles, and a process of irradiating ultraviolet (UV) light onto the dispersion solution.

In the method of preparing a polishing composition according to the present disclosure, an oxygen vacancy can be formed on ceria contained in a dispersion solution, and the amount of $Ce^{3+}$ can be increased through a simple process of irradiating UV light onto the dispersion solution containing ceria, and, thus, the prepared polishing material composition can have an improved removal rate.

That is, in the polishing composition according to the present disclosure, the amount of $Ce^{3+}$ can be effectively increased without adding a chemical additive.

In the method of preparing a polishing composition, according to the present disclosure, the reactivity increases due to the oxygen vacancy and the trivalent cerium cations ($Ce^{3+}$), which enables rapid reaction with a polishing target object. Therefore, a polishing rate increases. Since the polishing rate increases, the polishing time decreases, and the polishing composition is used in a small amount. Accordingly, the cost of processing can be reduced.

More specifically, if polishing is performed by applying the polishing composition onto a silicon wafer ($Si/SiO_2$) as the polishing target object, according to an embodiment of the present disclosure, an oxide film ($SiO_2$, a polishing target surface) formed on the silicon wafer reacts with $Ce^{3+}$ contained in the polishing composition to form a Ce—O—Si bond. Thus, the polishing target surface on which the Ce—O—Si bond is formed can be easily removed. Therefore, the polishing composition according to the present disclosure can have an improved removal rate.

In the method of preparing a polishing composition according to the present disclosure, a polishing composition with an improved removal rate can be prepared by adding a polymer onto a dispersion solution containing ceria.

In the method of preparing a polishing composition according to the present disclosure, a polishing composition with an improved removal rate can be prepared by adding an amino acid onto a dispersion solution containing ceria and irradiating UV light.

In this regard, the amino acid is photo-oxidized by irradiation of the UV light so that oxygen contained in the dispersion solution can be removed. Therefore, the formation of $Ce^{3+}$ on the polishing material can be promoted.

Further, the amino acid is photo-ionized by irradiation of the UV light, and radicals are activated. Therefore, the removal rate of the prepared polishing composition can be improved.

Furthermore, in preparing a polishing composition, according to the present disclosure, the amino acid is a zwitter ion and thus can stabilize or enhance zeta potential on the surface of a ceria particle. Therefore, the prepared polishing composition can have an improved attractive force with respect to the polishing target object and thus have an improved removal rate.

The processing time is decreased, and the UV light irradiation efficiency is increased by consecutively performing a process of preparing the polishing composition according to the present disclosure and a process of polishing using the polishing composition. Therefore, polishing can be completed in several seconds to achieve a high removal rate.

Specifically, if the surface area of the polishing material composition (or dispersion solution) irradiated with UV light is increased and light concentrated from a UV light source is irradiated to the polishing material composition (or dispersion solution), the process can be performed in-situ while the polishing material composition is shifted to a chemical mechanical polishing apparatus without requiring additional processing time.

The effects to be achieved by the present disclosure are not limited to the above-described effects. There may be other effects to be achieved by the present disclosure.

FIG. 1 is a conceptual diagram showing a problem caused by the high integration of a semiconductor.

As shown in FIG. 1, a step height is increased by a rapid increase in the number of vertical gates according to high integration of a semiconductor.

The method of preparing a polishing composition according to the present disclosure can provide a polishing composition, which can have a high removal rate with respect to an insulating film, particularly to solve the above-described problem.

Figure 2:
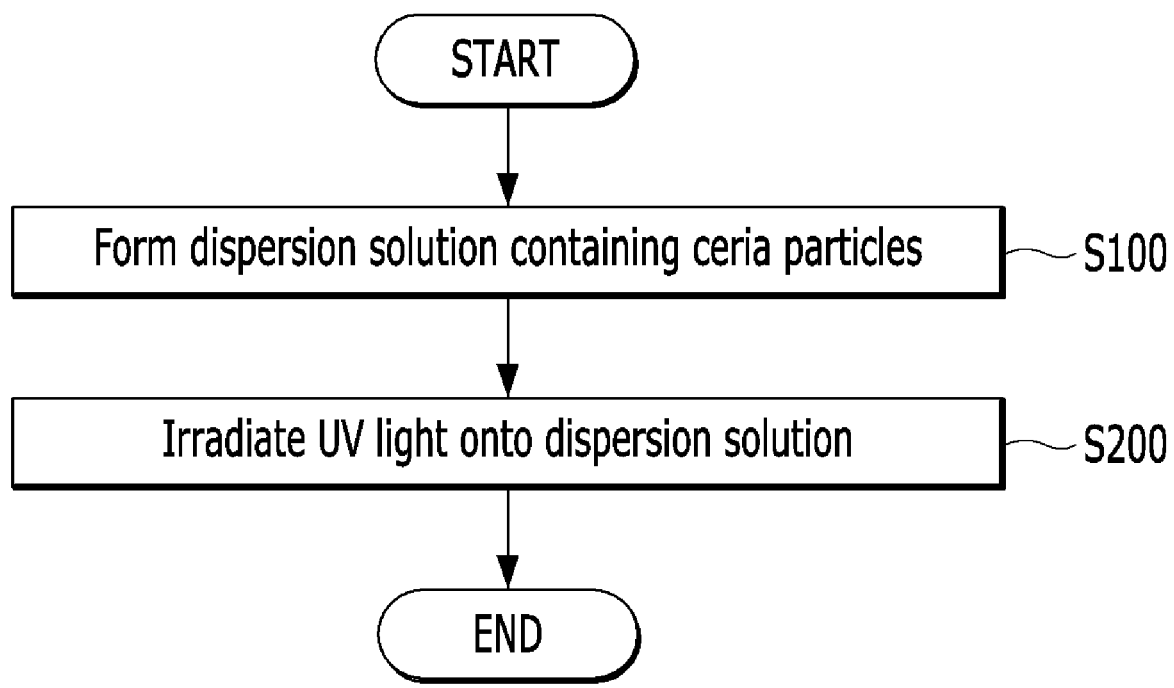
FIG. 2 is a flowchart of an example of preparing a polishing composition according to an embodiment of the present disclosure.

FIG. 2 is a flowchart showing a method of preparing a polishing composition according to an embodiment of the present disclosure.

First, a dispersion solution containing ceria particles is formed (S100).

Then, UV light is irradiated onto the dispersion solution (S200).

According to an embodiment of the present disclosure, an oxygen vacancy may be formed on the ceria particles through the process of irradiating UV light, but may not be limited thereto.

In the method of preparing a polishing composition according to the present disclosure, photo-oxidation occurs by irradiation of the UV light, and, thus, the oxygen vacancy is formed on the ceria particles.

Specifically, since the photo-oxidation occurs by irradiation of the UV light, holes are formed on the ceria particles so that oxygen vacancy can be easily formed.

According to an embodiment of the present disclosure, trivalent cerium cations ($Ce^{3+}$) may be increased on the ceria particles through the process of irradiating UV light, but may not be limited thereto.

Ceria ($CeO_2$) is the most stable oxide of cerium and has a fluorite ($CaF_2$) crystalline structure of a space group Fm3m in the range from room temperature to melting point and includes octacoordinated cations ($Ce^{4+}$) and tetracoordinated anions ($O^{2-}$). That is, $CeO_2$ has a structure in which eight tetrahedral sites of a face-centered cubic (FCC) composed of cations ($Ce^{4+}$) are filled with anions ($O^{2-}$).

Figure 3:
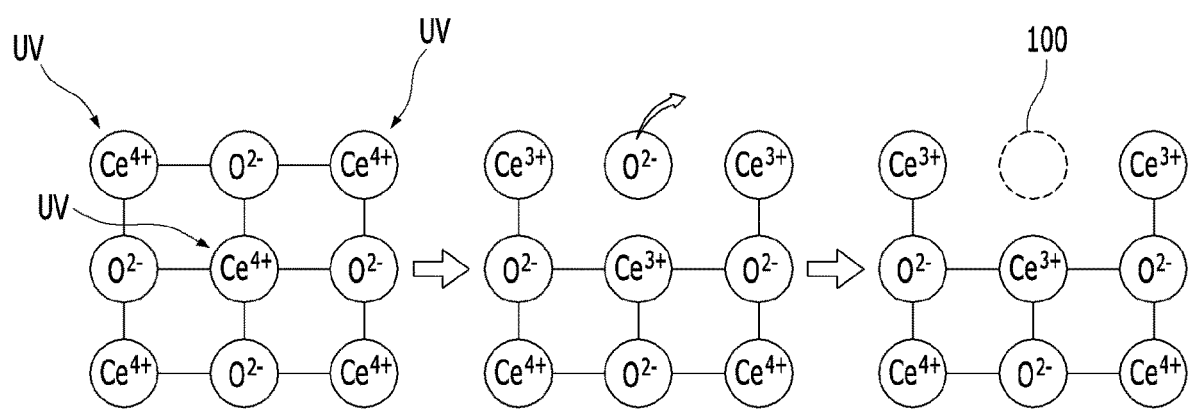
FIG. 3 is a schematic diagram of an example of reducing ceria by ultraviolet (UV) light during a process of preparing a polishing composition according to an embodiment of the present disclosure.

FIG. 3 is a schematic diagram showing a process of reducing ceria by ultraviolet (UV) light during a process of preparing a polishing composition according to an embodiment of the present disclosure.

Referring to FIG. 3, when the ceria ($CeO_2$) particles contained in the dispersion solution are reduced to $CeO_{2-\delta}$ by the UV light, tetravalent cerium ions ($Ce^{4+}$), which are cations composing ceria before reduction, may be converted (reduced) to trivalent cerium ions ($Ce^{3+}$) and a bond between cerium and oxygen may be broken to form an oxygen vacancy 100 at the same time.

Due to the oxygen vacancy 100 and the trivalent cerium ions ($Ce^{3+}$), the reactivity of the polishing composition according to the present disclosure increases, and, thus, the polishing composition can rapidly react with a polishing target object. Therefore, a polishing rate is increased. Since the polishing rate is increased, the polishing time decreases, and the polishing composition is used in a small amount. Accordingly, the cost of processing can be reduced.

Regarding the above-described increase in the reactivity of the polishing composition, when the polishing composition is applied to a polishing target object, $Ce^{3+}$ can form a chemical bond with a polishing target surface of the polishing target object.

More specifically, if polishing is performed by applying the polishing composition onto a silicon wafer ($Si/SiO_2$) as the polishing target object, according to an embodiment of the present disclosure, an oxide film ($SiO_2$, a polishing target surface) formed on the silicon wafer reacts with $Ce^{3+}$ contained in the polishing composition to form a Ce—O—Si bond. Thus, the polishing target surface on which the Ce—O—Si bond is formed can be easily removed. Therefore, the polishing composition according to the present disclosure can have a remarkably improved removal rate.

The polishing composition, according to the present disclosure, reduces the ceria in the dispersion solution through a simple process of irradiating UV light onto the dispersion solution, thus increasing the amount of $Ce^{3+}$.

That is, the amount of $Ce^{3+}$ can be effectively increased without adding a chemical additive.

Further, the reduced ceria may increase the reactivity with the polishing target object. For example, according to the present disclosure, the polishing composition can improve a removal rate by forming a chemical bond with the polishing target object.

As will be described below, the polishing target object may include a material selected from the group consisting of a substrate on which an insulating film is formed, a semiconductor substrate, a metal film, and combinations thereof, but may not be limited thereto.

The insulating film may be a member selected from the group consisting of an oxide film, a nitride film, an oxynitride film, a low-k film, a high-k film, and combinations thereof, but may not be limited thereto.

The semiconductor substrate may have a structure selected from the group consisting of a film, a layer, wiring, a pad, a plug, a gate, a capacitor, and combinations thereof, but may not be limited thereto.

The substrate may include a material selected from the group consisting of a glass substrate, a plastic substrate, a silicon substrate, a silicon oxide substrate, a Teflon film substrate, a sapphire substrate, a nitride substrate, and combinations thereof, but may not be limited thereto.

Figure 4:
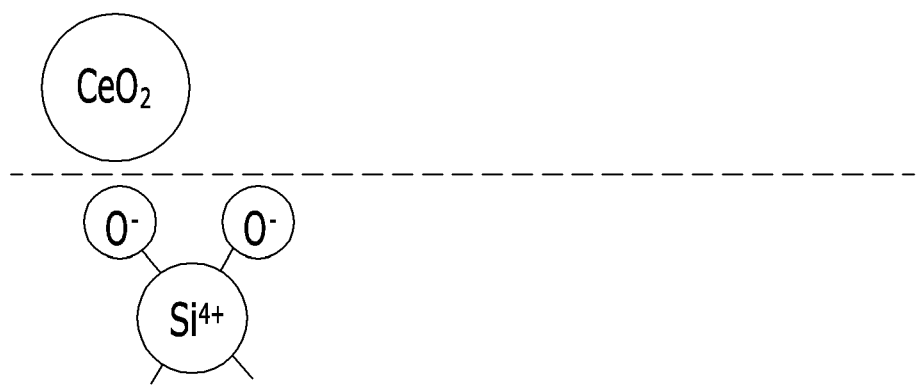
FIG. 4 is a schematic diagram showing the principle of polishing a conventional polishing composition according to a comparative example of the present disclosure.

FIG. 4 is a schematic diagram showing the principle of polishing a conventional polishing composition according to a comparative example of the present disclosure.

Figure 5:
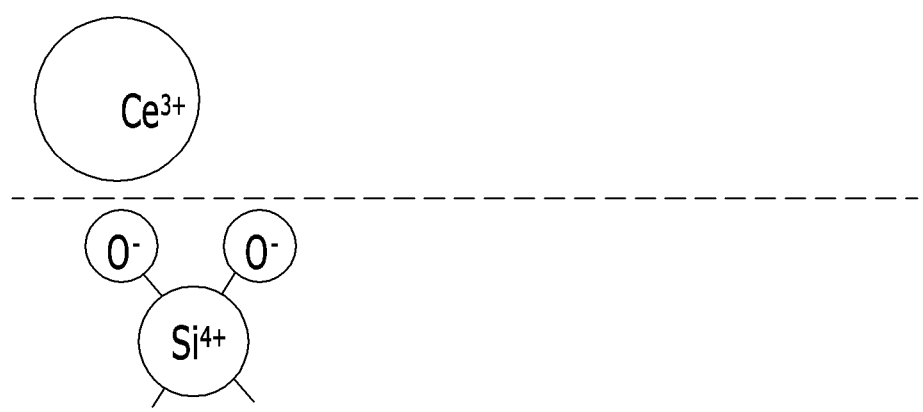
FIG. 5 is a schematic diagram showing the principle of polishing a polishing composition according to an embodiment of the present disclosure.

FIG. 5 is a schematic diagram showing the principle of polishing a polishing composition according to an embodiment of the present disclosure.

In the conventional polishing composition shown in FIG. 4, a ceria particle without an oxygen vacancy is used for polishing. In contrast, according to the present disclosure in the polishing composition shown in FIG. 5, a ceria particle includes the oxygen vacancy 100. Thus, a trivalent cerium cation is present on the ceria particle, which may improve the polishing efficiency.

According to an embodiment of the present disclosure, a removal rate of the polishing composition may be regulated by regulating an irradiation time of the UV light, but may not be limited thereto.

Specifically, in the polishing composition of the present disclosure, as the irradiation time of the UV light increases, the number of oxide vacancies 100 increases. Therefore, more trivalent cerium cations can be formed on the ceria particles.

According to an embodiment of the present disclosure, the dispersion solution may further contain a polymer, but may not be limited thereto.

In the method of preparing a polishing composition according to the present disclosure, a removal rate of the prepared polishing composition can be remarkably improved by adding the polymer onto the dispersion solution and irradiating the UV light.

In general, a polymer is known as a dispersant for improving the dispersibility of polishing materials within a slurry through steric effect or electrostatic stabilization or an inhibitor for inhibiting polishing of a membrane.

However, in the method of preparing a polishing composition according to the present disclosure, a removal rate of the prepared polishing composition is remarkably increased by adding the polymer and then irradiating UV light thereto. This can be because the polymer is photo-degraded by the UV light to reduce the dissolved oxygen content in the solution. For example, the polymer consumes oxygen when photo-degradation occurs. Finally, the polymer undergoes chain scission so that the polymer is degraded.

As described above, the method of preparing a polishing composition, according to the present disclosure, can increase the amount of $Ce^{3+}$ on the surface of a ceria particle. To this end, the oxygen vacancy is formed on ceria to induce $CeO_{2-x}$ and reduce $Ce^{4+}$ to $Ce^{3+}$. In the method of preparing a polishing composition, according to the present disclosure, an increase in the amount of $Ce^{3+}$ on the surface of a ceria particle caused by the formation of the oxygen vacancy as described above can be achieved simply by irradiating UV light.

In this regard, when the UV light is irradiated, a valence hole is formed so that oxygen vacancy formation energy can be reduced to induce the formation of an oxygen vacancy or the valence hole can directly form an oxygen vacancy. Here, when the oxygen vacancy is formed, existing oxygen is dissolved by a solvent. However, in an oxygen-rich environment, the formation of an oxygen vacancy may be suppressed, or reoxidation may occur. Therefore, it is necessary to lower the concentration of oxygen around a particle and promote the formation of an oxygen vacancy.

In this regard, in the method of preparing a polishing composition according to the present disclosure, oxygen present on the dispersion solution can be removed by using oxidation of the polymer during photo-degradation, and, thus, an increase in the concentration of $Ce^{3+}$ on the surface of a ceria particle can be promoted. Therefore, a polishing composition with a high removal rate can be prepared. Further, the degraded polymer, i.e., the polymer whose molecular weight has been decreased, is less effective in inhibiting a direct contact of the particle with the wafer. Therefore, it is possible to achieve a much higher removal rate than when only the polymer is added.

According to an embodiment of the present disclosure, the polymer may include a member selected from the group consisting of polymethacrylate, ammonium polymethacrylate, polycarboxylic acid, carboxyl acrylic polymer, and combinations thereof, but may not be limited thereto.

According to an embodiment of the present disclosure, in the polishing composition, the amount of the polymer may be from 0.05 parts by weight to 0.2 parts by weight based on 100 parts by weight of the polishing composition, but may not be limited thereto.

According to an embodiment of the present disclosure, the dispersion solution may further contain amino acid, but may not be limited thereto.

In the method of preparing a polishing composition according to the present disclosure, a removal rate of the prepared polishing composition can be remarkably improved by further adding the amino acid onto the dispersion solution and irradiating the UV light.

In this regard, the amino acid is photo-oxidized by irradiation of the UV light so that oxygen contained in the dispersion solution can be removed. Therefore, the formation of $Ce^{3+}$ on the polishing material can be promoted.

Further, the amino acid is photo-ionized by irradiation of the UV light, and radicals are activated. Therefore, the removal rate of the prepared polishing composition can be improved.

Furthermore, in the method of preparing a polishing composition according to the present disclosure, the amino acid is a zwitter ion and thus can stabilize or enhance zeta potential on the surface of a ceria particle. Therefore, the prepared polishing composition can have an improved attractive force with respect to the polishing target object and thus have an improved removal rate.

The amino acid is photo-oxidized by irradiation of the UV light so that oxygen contained in the dispersion solution can be removed. Therefore, the formation of $Ce^{3+}$ on the polishing material can be promoted.

According to an embodiment of the present disclosure, the amino acid may include a member selected from the group consisting of tryptophan, tyrosine, cysteine, proline, alanine, isoleucine, glycine, valine, phenylalanine, leucine, methionine, asparagine, threonine, glutamine, serine, histidine, arginine, lysine, glutamic acid, aspartic acid, and combinations thereof, but may not be limited thereto.

According to an embodiment of the present disclosure, in the polishing composition, the amount of the amino acid may be from 0.05 parts by weight to 0.2 parts by weight based on 100 parts by weight of the polishing composition, but may not be limited thereto.

Figure 6:
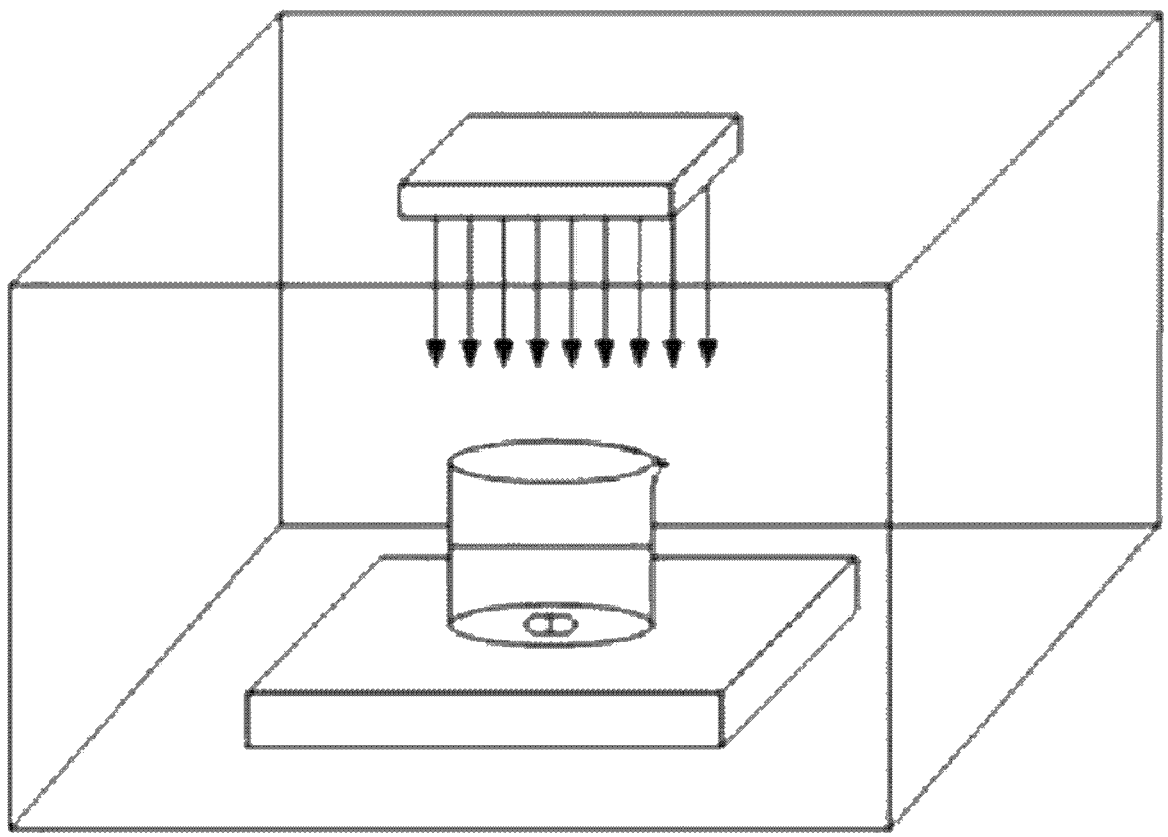
FIG. 6 is a schematic diagram illustrating an example of an apparatus for preparing a polishing composition according to an embodiment of the present disclosure.

FIG. 6 illustrates a method of preparing a polishing composition according to the present disclosure by which UV light is directly irradiated onto the dispersion solution using a UV irradiator within a chamber. Further, FIG. 6 illustrates a method of preparing a polishing composition according to the present disclosure by which the dispersion solution is mixed using a stirrer while the UV light is irradiated.

According to a second aspect of the present disclosure, a polishing composition is prepared by the preparation method according to the first aspect of the present disclosure.

Detailed descriptions of the method of preparing a polishing composition according to the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

According to a third aspect of the present disclosure, there is provided a chemical mechanical polishing method, including: a process of coating the polishing composition according to the second aspect of the present disclosure on a polishing target object; and a process of applying a mechanical force onto the polishing target object coated with the polishing composition.

Figure 7:
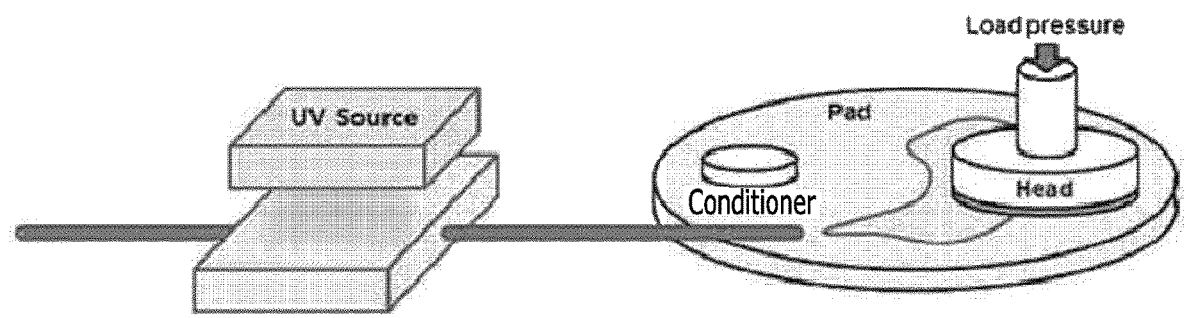
FIG. 7 is a schematic diagram illustrating an example of an apparatus for preparing a polishing composition and performing a chemical mechanical polishing method according to an embodiment of the present disclosure.

FIG. 7 is a schematic diagram illustrating an apparatus for preparing a polishing composition and performing a chemical mechanical polishing method according to an embodiment of the present disclosure.

FIG. 7 illustrates consecutive processes, including preparing a polishing composition by irradiating UV light onto the dispersion solution and then performing chemical mechanical polishing using the prepared polishing composition.

As can be seen from FIG. 7, the processing time is decreased, and the UV light irradiation efficiency is increased by consecutively performing the process of preparing the polishing composition according to the present disclosure and the process of polishing using the polishing composition. Therefore, polishing can be completed in several seconds to achieve a high removal rate.

Specifically, if the surface area of the polishing material composition (or dispersion solution) irradiated with UV light is increased and light concentrated from a UV light source is irradiated to the polishing material composition (or dispersion solution), the process can be performed in-situ while the polishing material composition is shifted to a chemical mechanical polishing apparatus without requiring additional processing time.

According to an embodiment of the present disclosure, the polishing target object may include a material selected from the group consisting of a substrate on which an insulating film is formed, a semiconductor substrate, a metal film, and combinations thereof, but may not be limited thereto.

The above-described aspects are provided by way of illustration only and should not be construed as liming the present disclosure. Besides the above-described embodiments, there may be additional embodiments described in the accompanying drawings and the detailed description.

Hereinafter, the present disclosure will be described in more detail with reference to examples. The following examples are provided only for explanation, but do not intend to limit the scope of the present disclosure.

Example 1

Example 1-1

Figure 8:
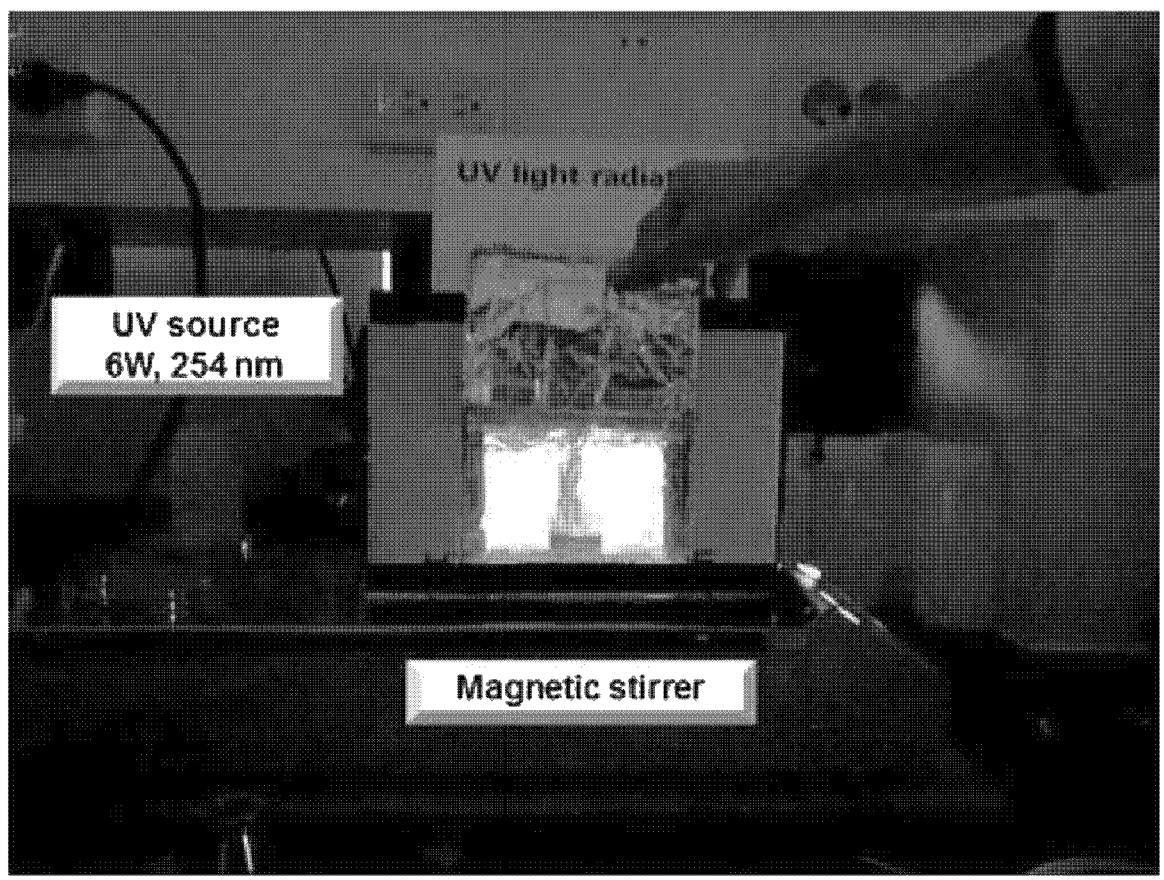
FIG. 8 is a photograph showing that a method of preparing a polishing composition according to an example of the present disclosure is performed.

FIG. 8 is a photograph showing that a method of preparing a polishing composition according to an example of the present disclosure is performed.

Referring to FIG. 8, UV light was irradiated to 1 wt % ceria slurry titrated to pH 7 to pH 9 inside a chamber coated with aluminum foil. Here, a UV source irradiated UV light with an intensity of 6 W at a wavelength of 254 nm. The slurry was continuously stirred at 400 rpm using a magnetic stirrer in order for the UV light to be uniformly irradiated to ceria particles in the slurry. The UV source was located about 3.5 cm above a liquid surface and irradiated UV light for more than 0 min to 3,000 min in the present test.

According to the above-described method, two types of polishing compositions were prepared using two types of ceria shown in Table 1.

TABLE 1

| Ceria slurry A | | | |
|---|---|---|---|
| State | Mean particle size | pH | Remarks |
| Slurry | 130 nm | pH 9 | Unknown chemical additive |
| Ceria slurry B | | | |
| State | Mean particle size | pH | Remarks |
| Powder | 100 nm | pH 7 | KOH |

TABLE 1-continued

FIG. 9 provides transmission electron microscope (TEM) images of ceria slurries used for preparing a polishing composition according to an example of the present disclosure.

Referring to FIG. 9, the shape and size of Ceria slurry A and Ceria slurry B used in the present example can be visually checked.

FIG. 10A is the result of X-ray photoelectron spectroscopy (XPS) showing changes in the concentration of trivalent cerium ions caused by irradiation of UV light in a method of preparing a polishing composition according to an example of the present disclosure.

FIG. 10B is the result of X-ray photoelectron spectroscopy (XPS) showing changes in the concentration of trivalent cerium ions caused by irradiation of UV light in a method of preparing a polishing composition according to an example of the present disclosure.

Referring to FIG. 10A and FIG. 10B, it can be seen that as UV light was irradiated, the intensity of a peak corresponding to $Ce^{3+}$ increased, and it can be seen from the area ratio that the percentage of $Ce^{3+}$ increased. It can be seen that as UV light was irradiated, the percentage of $Ce^{3+}$ in both Ceria slurries A and B increased by about 7%.

Example 1-2

A polishing composition was prepared by adding a 0.1 wt % polymer to 1 wt % ceria slurry (Ceria slurry A) titrated to pH 7 to pH 9 and then irradiating UV light for 2 hours same manner as described above.

Example 1-3

A polishing composition was prepared by adding 0.1 wt % amino acid to 1 wt % ceria slurry (Ceria slurry A) titrated to pH 7 to pH 9 and then irradiating UV light for 40 minutes in the same manner as described above.

Example 2

Chemical mechanical polishing was performed to an $SiO_2$ film having a thickness of 1 μm on a 4-inch wafer using the polishing composition prepared in Example 1. The polishing was performed under the conditions of a slurry flow rate of 180 ml/min, a polishing time period of 1 min, a pressure of 3 psi, a pad rotation speed of 93 rpm, and a wafer rotation speed of 87 rpm.

First, the surface of the wafer was conditioned with deionized water DIW for 1 minute, and then, the surface of the wafer was conditioned with the polishing composition for 30 seconds. Subsequently, the surface of the wafer was polished for 1 minute by using the polishing composition.

Figure 11:
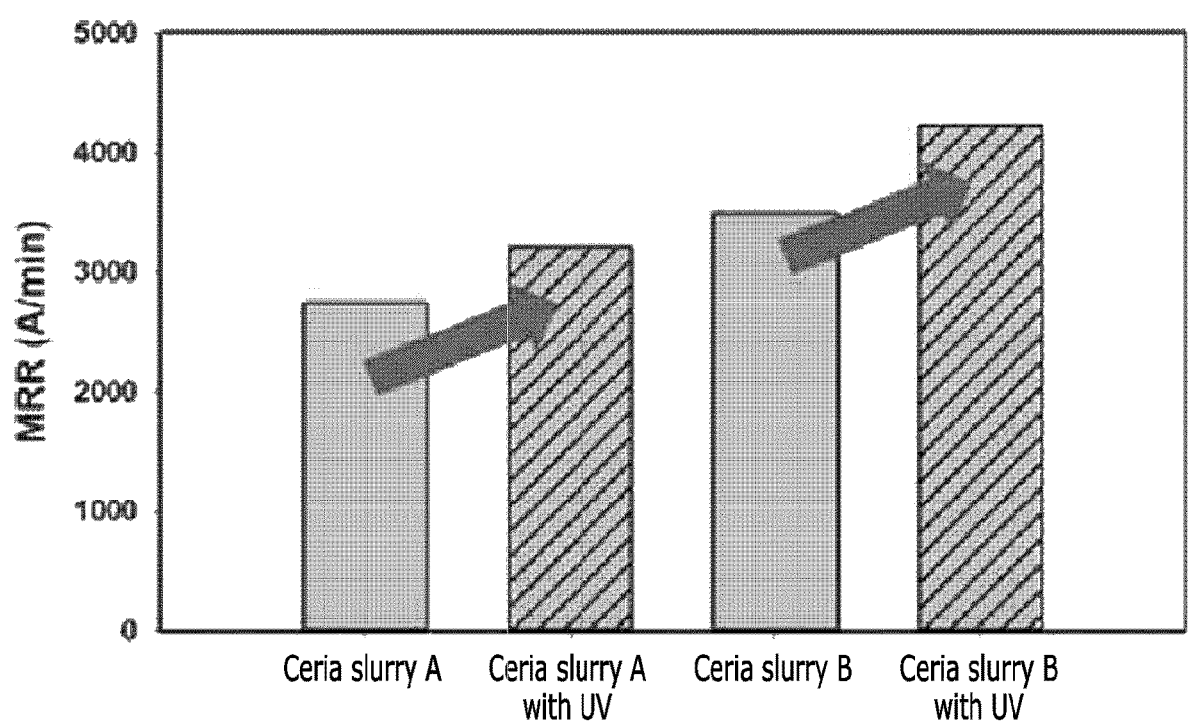
FIG. 11 shows a material removal rate (MRR) in a chemical mechanical polishing method according to an example of the present disclosure.

FIG. 11 shows a material removal rate (MRR) in a chemical mechanical polishing method according to an example of the present disclosure.

Referring to FIG. 11, it can be seen that an MRR with respect to an oxide membrane increased after irradiation of UV light. It is considered that the concentration of $Ce^{3+}$ was increased due to an increase of oxygen vacancy, which resulted in an increase in the MRR.

Figure 12:
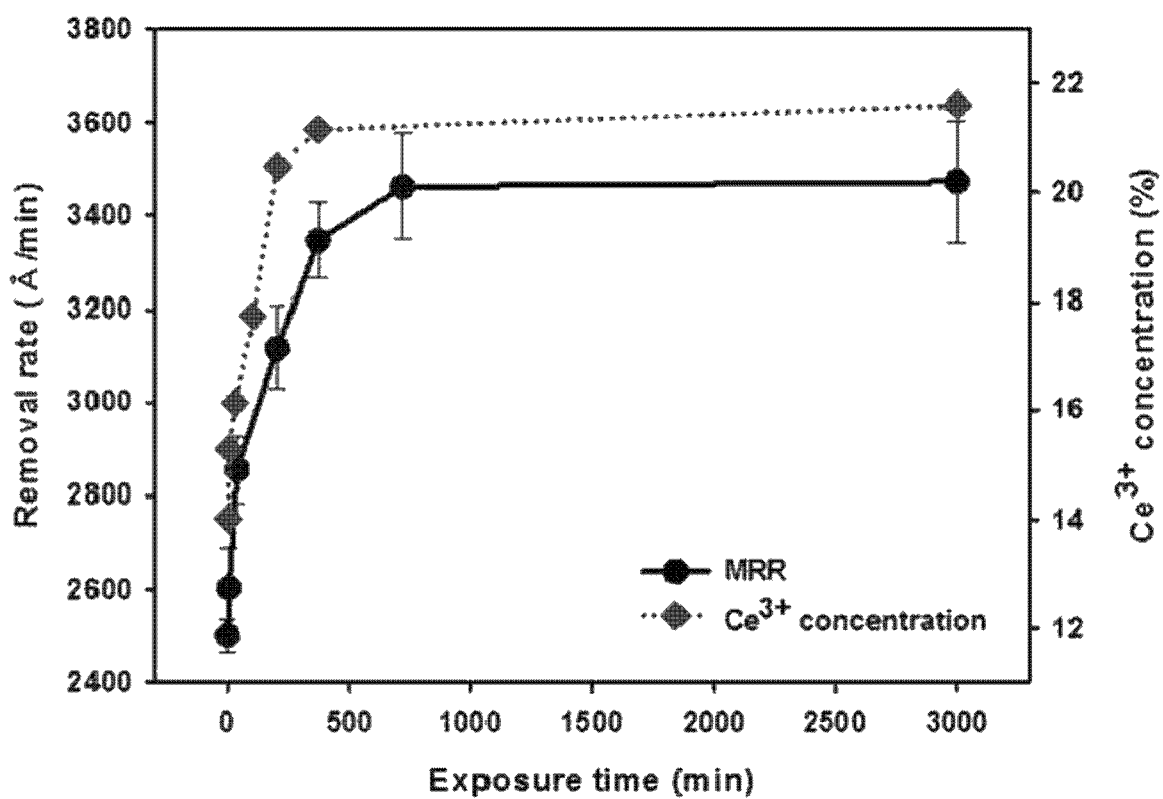
FIG. 12 is a graph showing a material removal rate (MRR) over time in a chemical mechanical polishing method according to an example of the present disclosure.

FIG. 12 shows a material removal rate (MRR) and the concentration of $Ce^{3+}$ over time in a chemical mechanical polishing method according to an example of the present disclosure.

FIG. 12 relates to the polishing composition prepared using Ceria slurry A in Example 1-1. It can be seen from FIG. 12 that the MRR and the concentration of $Ce^{3+}$ increased as the time of UV light irradiation increased and were stabilized after 12 hours. The UV efficiency in the water is lower than that in the ambient state. However, it can be seen that irradiation for just 5 minutes can cause a sharp increase in the MRR.

Figure 13:
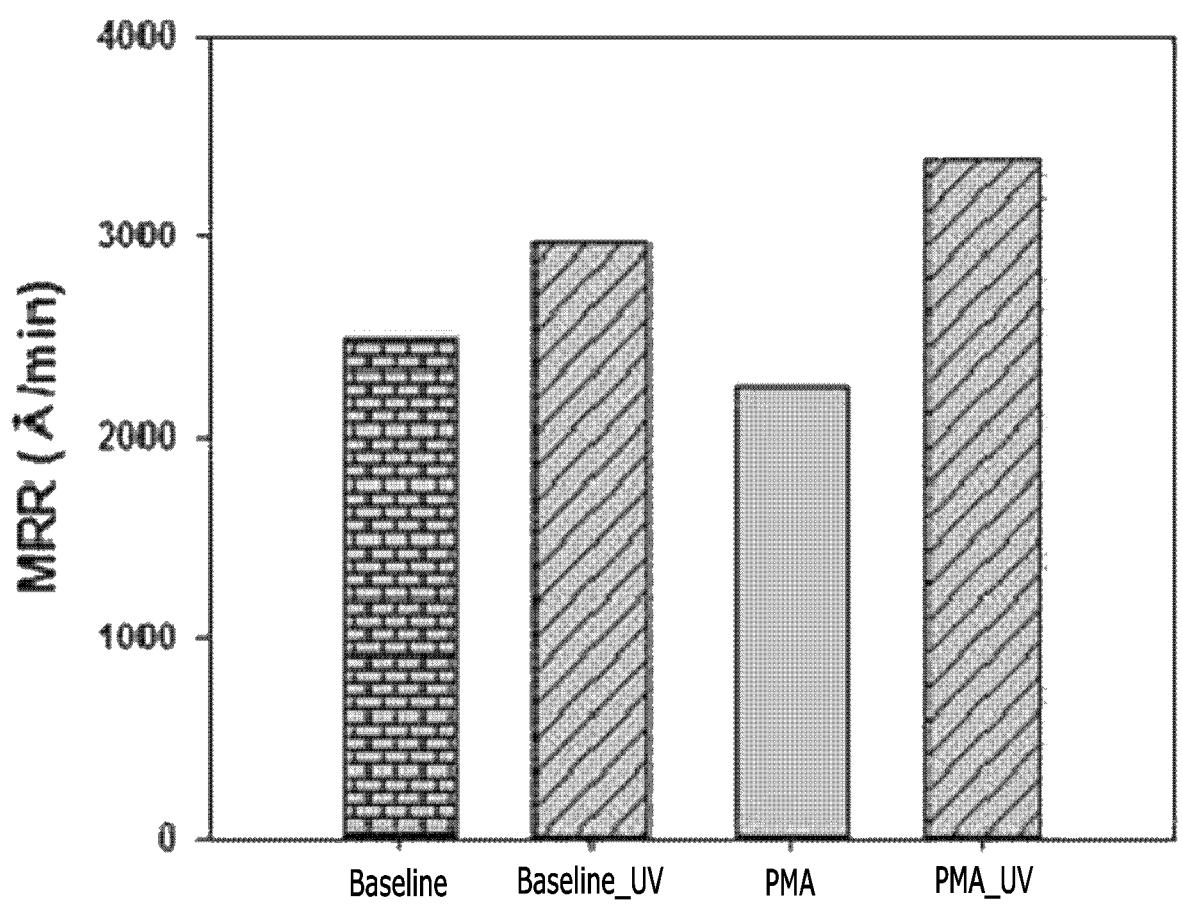
FIG. 13 is a graph showing a material removal rate (MRR) over time in a chemical mechanical polishing method according to an example of the present disclosure.

FIG. 13 is a graph showing a material removal rate (MRR) over time in a chemical mechanical polishing method according to an example of the present disclosure.

FIG. 13 relates to a polishing effect of the polishing material composition PMA_UV prepared using Ceria slurry A in Example 1-2. It can be seen from FIG. 13 that when 0.1 wt % PMA {Poly(methacrylic acid)} polymer was added (PMA in FIG. 13), the MRR decreased in a normal state, but when UV light was irradiated for 2 hours after the polymer was added (PMA_UV in FIG. 13), the MRR increased sharply (in FIG. 13, Baseline refers to the case where polishing was performed using a dispersion solution which was not yet irradiated with UV light in Example 1-1, Baseline_UV refers to the case where polishing was performed using a dispersion solution which was irradiated with UV light in Example 1-1).

Figure 14:
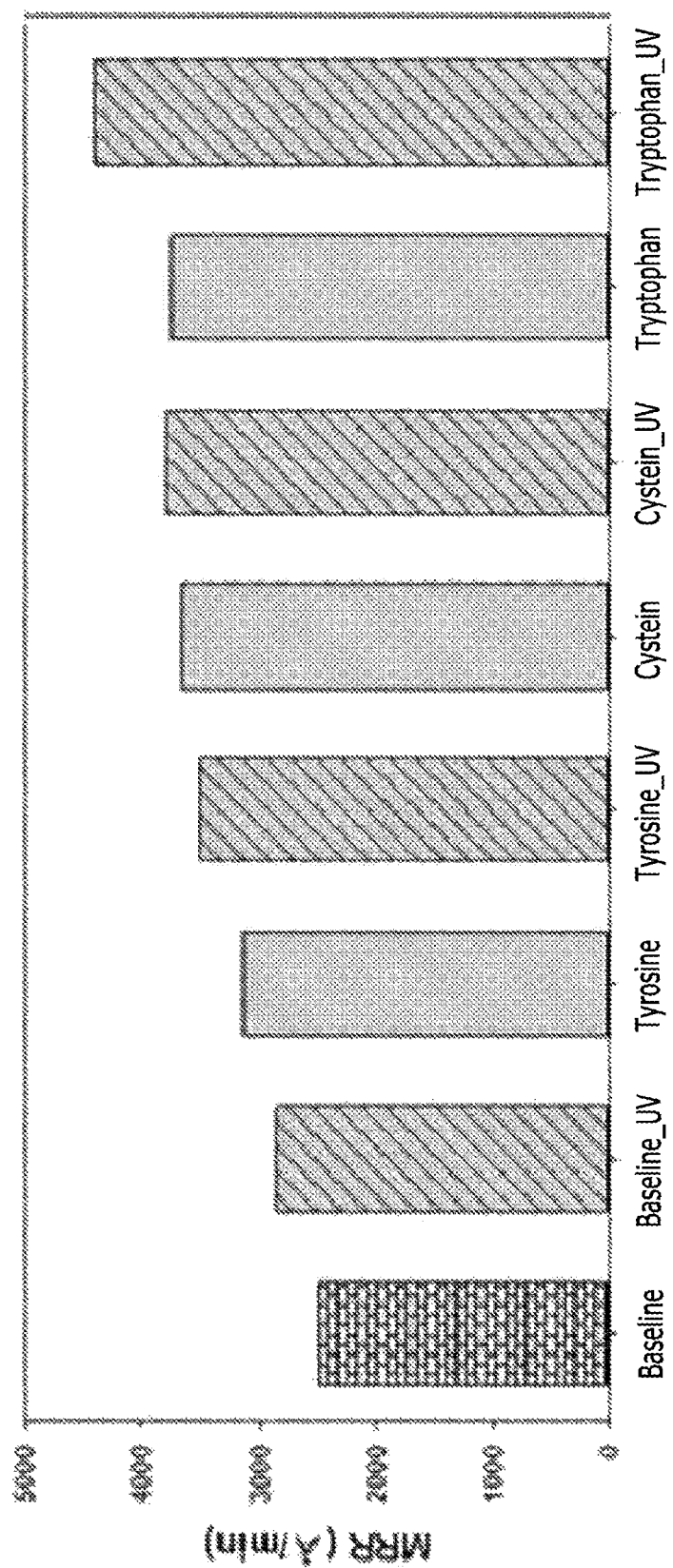
FIG. 14 is a graph showing a material removal rate (MRR) over time in a chemical mechanical polishing method according to an example of the present disclosure.

FIG. 14 is a graph showing a material removal rate (MRR) over time in a chemical mechanical polishing method according to an example of the present disclosure.

FIG. 14 relates to a polishing effect of the polishing material composition prepared using Ceria slurry A in Example 1-3. It can be seen from FIG. 14 that when a 0.1 wt % amino acid was added and then UV light was irradiated for 40 minutes, tryptophan, tyrosine and cysteine absorbed the UV light. The amino acid was photo-oxidized while promoting the formation of an oxygen vacancy on the surface of a ceria particle using oxygen in the dispersion solution and radicals were activated by photo-ionization of the amino acid. Thus, the MRR of the polishing composition was improved (in FIG. 14, Baseline refers to the case where polishing was performed using a dispersion solution which was not yet irradiated with UV light in Example 1-1, Baseline_UV refers to the case where polishing was performed using a dispersion solution which was irradiated with UV light in Example 1-1).

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of preparing a polishing composition, the method comprising:
   forming a dispersion solution comprising ceria particles; and forming the polishing composition by irradiating ultraviolet (UV) light to the dispersion solution when the dispersion solution comprising the ceria particles is stirred using a stirrer in order for the UV light to be uniformly irradiated to the ceria particles, wherein the irradiating of the UV light to the dispersion solution forms additional trivalent cerium cations ($Ce^{3+}$) on the ceria particles in the dispersion solution.

2. The method of claim 1, wherein the UV light has a wavelength of 254 nm, and wherein the irradiating UV light to the dispersion solution forms an oxygen vacancy on the ceria particles in the dispersion solution.

3. The method of claim 1, wherein a removal rate of the polishing composition is regulated by regulating an irradiation time of the UV light.

4. The method of claim 1, wherein the dispersion solution further comprises a polymer, and wherein the UV light is irradiated to the dispersion solution when the dispersion solution comprising the polymer and the ceria particles is stirred.

5. The method of claim 4, wherein the polymer includes a member selected from the group consisting of polymethacrylate, ammonium polymethacrylate, polycarboxylic acid, carboxyl acrylic polymer, and combinations thereof.

6. The method of claim 4, wherein, in the polishing composition, an amount of the polymer is from 0.05 parts by weight to 0.2 parts by weight based on 100 parts by weight of the polishing composition.

7. The method of claim 1, wherein the dispersion solution further comprises amino acid, and wherein the UV light is irradiated to the dispersion solution when the dispersion solution comprising the amino acid and the ceria particles is stirred.

8. The method of claim 7, wherein the amino acid includes a member selected from the group consisting of tryptophan, tyrosine, cysteine, proline, alanine, isoleucine, glycine, valine, phenylalanine, leucine, methionine, asparagine, threonine, glutamine, serine, histidine, arginine, lysine, glutamic acid, aspartic acid, and combinations thereof.

9. The method of claim 7, wherein, in the polishing composition, an amount of the amino acid is from 0.05 parts by weight to 0.2 parts by weight based on 100 parts by weight of the polishing composition.

10. A chemical mechanical polishing method, the method comprising:

forming a dispersion solution comprising ceria particles; and forming a polishing composition by irradiating ultraviolet (UV) light to the dispersion solution when the dispersion solution comprising the ceria particles is stirred using a stirrer to uniformly irradiate the ceria particles;

coating the polishing composition on a polishing target object; and applying a mechanical force onto the polishing target object coated with the polishing composition, wherein the irradiating of the UV light to the dispersion solution forms additional trivalent cerium cations ($Ce^{3+}$) on the ceria particles in the dispersion solution.

11. The method of claim 10, wherein the polishing target object includes a material selected from the group consisting of a substrate on which an insulating film is formed, a semiconductor substrate, a metal film, and combinations thereof.

* * * * *